United States Patent
Kelley et al.

(10) Patent No.: US 11,533,825 B2
(45) Date of Patent: Dec. 20, 2022

(54) SYSTEMS WITH INDIUM APPLICATION TO HEAT TRANSFER SURFACES

(71) Applicant: Microsoft Technology Licensing, LLC, Redmond, WA (US)

(72) Inventors: Douglas Patrick Kelley, Sammamish, WA (US); James Anthony Fikse, Bellevue, WA (US); Alexis Grace Schubert, Seattle, WA (US); Kathryn Midori Oseen-Senda, Seattle, WA (US); Martin B. Christiansen, Laurel, MD (US); Matthew David Turner, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/114,724

(22) Filed: Dec. 8, 2020

(65) Prior Publication Data
US 2022/0183187 A1   Jun. 9, 2022

(51) Int. Cl.
*H05K 7/20* (2006.01)
*H05K 7/14* (2006.01)
*F28F 21/08* (2006.01)

(52) U.S. Cl.
CPC ....... *H05K 7/20709* (2013.01); *F28F 21/081* (2013.01); *H05K 7/1488* (2013.01)

(58) Field of Classification Search
CPC ........................................................ H05K 7/00
See application file for complete search history.

(56) References Cited

U.S. PATENT DOCUMENTS

| 10,165,667 B1* | 12/2018 | Christiansen | H05K 7/20372 |
| 10,394,292 B1 | 8/2019 | Van Dyke | |
| 10,720,372 B2 | 7/2020 | Kelley | |

(Continued)

FOREIGN PATENT DOCUMENTS

WO    2020190434 A1    9/2020

OTHER PUBLICATIONS

"Indium Bonding", Retrieved From: https://labcit.ligo.caltech.edu/~ctorrie/SUS_MEETING/daylinks/library%20of%20daylinks/Indium%20Bonding.pdf, Retrieved on Dec. 10, 2020, 3 Pages.

(Continued)

*Primary Examiner* — Jerry Wu
(74) *Attorney, Agent, or Firm* — Ranjeev Singh; Singh Law, PLLC

(57) ABSTRACT

Systems with indium application to heat transfer surfaces and related methods are described. A system includes a chassis, arranged inside a housing, having at least one slot for receiving a blade. The blade, arranged in a slot of the chassis, includes a first circuit board having a plurality of components mounted on a substrate. The blade further includes a first heat spreader comprising a metal. The first heat spreader including metal is arranged to transfer heat from the first circuit board to a cooling system via a first interface between a first surface of the first heat spreader and a second surface of the chassis, and where indium is permanently bonded to either the first surface of the first heat spreader, or the second surface of the chassis, or both the first surface of the first heat spreader and the second surface of the chassis.

11 Claims, 7 Drawing Sheets

(56) References Cited

U.S. PATENT DOCUMENTS

2019/0326619 A1* 10/2019 Winter .............. H01M 8/04007
2020/0135608 A1  4/2020 Kelley

OTHER PUBLICATIONS

"Solders—Products Made by Indium Corporation", Retrieved From: https://www.indium.com/products/solders/#solder-ribbon, Retrieved on Oct. 22, 2020, 5 Pages.

Choi, Yeon Suk, "Cryogenic Cooling System by Natural Convection of Subcooled Liquid Nitrogen for HTS Transformers", In Dissertation Submitted to the Department of Mechanical Engineering in Partial Fulfillment of the Requirements for the Degree of Doctor of Philosophy, 2004, 138 Pages.

Ekin, Jack W. , "Fig. 2.7 Wcap", In Book of Experimental Techniques for Low-Temperature Measurements, Oxford University Press, 2006, 1 Page.

"International Search Report and Written Opinion Issued in PCT Application No. PCT/US2021/058881", dated Feb. 25, 2022, 14 Pages.

* cited by examiner

SYSTEMS WITH INDIUM APPLICATION TO HEAT TRANSFER SURFACES

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems. As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors.

An additional approach to the use of processors and related components, based on CMOS technology, is the use of superconducting logic-based components and devices. Superconducting logic-based components and devices can also be used to process quantum information, such as qubits. However, such devices need to operate at cryogenic temperatures and thus require additional cooling. In some instances, the CMOS-based components and the superconducting-logic based components can be integrated as part of the same system.

SUMMARY

In one aspect, the present disclosure relates to a system including a housing configured to maintain a lower pressure inside the housing than a pressure outside the housing. The system may further include a chassis, arranged inside the housing. The chassis may comprise at least one slot for receiving a blade. The blade may include a circuit board having a plurality of components mounted on a substrate. The chassis may be coupled to a cooling system to maintain at least a subset of the plurality of components operating in an environment having a temperature at or below 200 Kelvin. The blade, arranged in a slot of the chassis, may include a first heat spreader comprising a metal. The first heat spreader including metal may be arranged to transfer heat from the first circuit board to the cooling system via a first interface between a first surface of the first heat spreader and a second surface of the chassis, and where indium is permanently bonded to either the first surface of the first heat spreader, or the second surface of the chassis, or both the first surface of the first heat spreader and the second surface of the chassis.

In another aspect the present disclosure relates to a method for assembling a computing system comprising at least one blade including a first circuit board and a second circuit board, where at least one of the first circuit board or the second circuit board includes superconducting components configured to operate in an environment having a temperature at or below 200 Kelvin. The method may include forming a first heat spreader configured to transfer heat from the first circuit board to a cooling system associated with the computing system. The method may further include forming a second heat spreader configured to transfer heat from the second circuit board to a cooling system associated with the computing system. The method may further include permanently bonding indium to a first selected surface of the first heat spreader, where the first selected surface is part of a first heat transfer path from the first circuit board to the cooling system. The method may further include permanently bonding indium to a second selected surface of the second heat spreader, where the second selected surface is part of a second heat transfer path from the second circuit board to the cooling system. The method may further include installing the first circuit board and the second circuit board in a chassis associated with the computing system.

In yet another aspect, the present disclosure relates to a system including a housing configured to maintain a lower pressure inside the housing than a pressure outside the housing. The system may further include a chassis, arranged inside the housing, where the chassis comprises at least one slot for receiving a blade, where the blade comprises a first circuit board having a plurality of superconducting components mounted on a first substrate and a second circuit board having a plurality of non-superconducting components mounted on a second substrate. The chassis may be coupled to a cooling system to maintain the plurality of superconducting components operating in an environment having a temperature at or below 200 Kelvin. The chassis may be coupled to the cooling system to maintain the plurality of non-superconducting components operating in an environment having a temperature at or below 300 Kelvin. The blade, arranged in a slot of the chassis, may include a first heat spreader comprising a metal, where the first heat spreader is arranged to transfer heat from the first circuit board to the cooling system via a first interface between a first surface of the first heat spreader and a second surface of the chassis, and where indium is permanently bonded to either the first surface of the first heat spreader, or the second surface of the chassis, or both the first surface of the first heat spreader and the second surface of the chassis. The blade may further include a second heat spreader comprising a metal, where the second heat spreader is arranged to transfer heat from the second circuit board to the cooling system via a second interface between a third surface of the second heat spreader and a fourth surface of the chassis, and where indium is permanently bonded to either the third surface of the second heat spreader, or the fourth surface of the chassis, or both the third surface of the second heat spreader and the fourth surface of the chassis.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
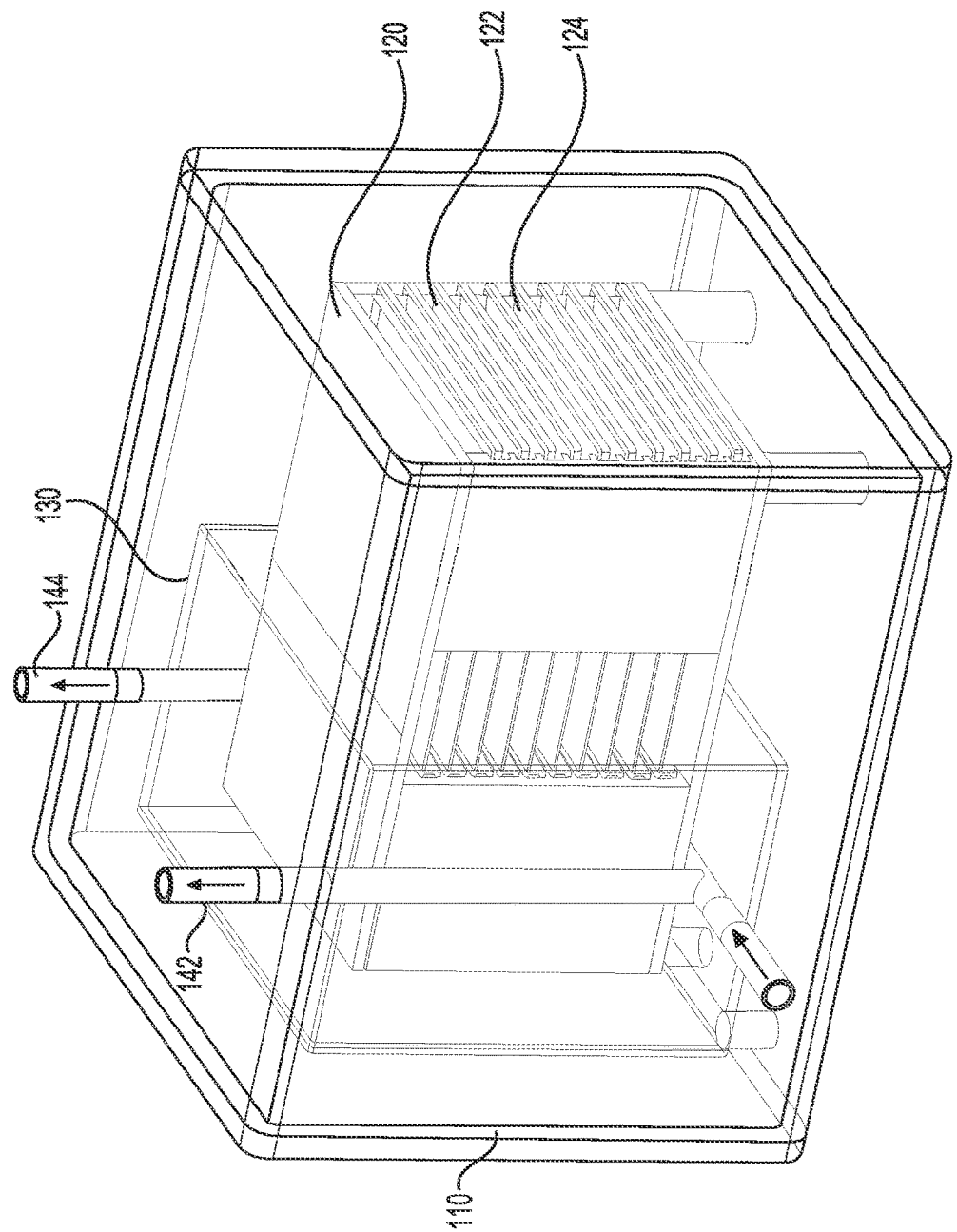
FIG. 1 shows a diagram of a cryogenic system comprising a housing including a chassis for receiving circuit boards in accordance with one example.

Examples described in this disclosure relate to cryogenic systems with indium application to heat sinks and heat loads. Certain examples of cryogenic systems include computing systems having superconducting components and devices. Certain examples of the present disclosure relate to a computing system comprising components operating at cryogenic temperatures (e.g., at or below 200 Kelvin). In one example, the computing system is housed in a vacuum assembly. In this example, the superconducting system may include one or more superconducting component formed on a substrate. The superconducting component may include integrated circuit chips mounted on the substrate. The packaging of such superconducting components is challenging because such components may need to withstand large changes in the ambient temperature (e.g., from about 300 Kelvin to about 4 Kelvin or lower).

Superconducting components and devices may use Josephson junctions to implement the functionality associated with a circuit. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the superconducting circuits. As an example, superconductors are materials that can carry a direct electrical current (DC) in the absence of an electric field. Superconductors have a critical temperature (Tc) below which they have zero resistance. Niobium, one such superconductor, has a critical temperature (Tc) of 9.3 Kelvin. At temperatures below Tc, niobium is superconductive; however, at temperatures above Tc, it behaves as a normal metal with electrical resistance. Thus, in the SIS type of Josephson junction superconductors may be niobium superconductors and insulators may be $Al_2O_3$ barriers. In SIS type of junctions, the superconducting electrons are described by a quantum mechanical wave-function. A changing phase difference in time of the phase of the superconducting electron wave-function between the two superconductors corresponds to a potential difference between the two superconductors.

Various superconducting circuits including transmission lines can be formed by coupling multiple Josephson junctions by inductors or other components, as needed. Microwave pulses can travel via these transmission lines under the control of at least one clock. The microwave pulses can be positive or negative or a combination thereof. The microwave pulses may have a frequency of up to 10 GHz or higher. Any circuit board or other type of structure, such as an interposer with such superconducting circuits, may be required to support not only the high-frequency microwave signals but also direct current (DC) signals. Although there are several benefits of superconductivity, including lower resistance and better bandwidth characteristics, superconducting materials need to be operated at temperatures below their critical temperature and thus require additional cooling.

FIG. 1 shows a diagram of a cryogenic system 100 comprising a housing 110 including a chassis for receiving blades in accordance with one example. In this example, housing 110 may be configured to maintain a lower pressure inside the housing than a pressure outside the housing. In one example, housing 110 may be configured to maintain a vacuum inside the housing. The lower pressure inside the housing may be a vacuum that corresponds to a pressure in a range between $10^{-3}$ Torr to $10^{-10}$ Torr. Thus, several components (e.g., processors and memory) corresponding to cryogenic system 100 may be located inside housing 110 that maintains vacuum. The use of the vacuum ensures that there is no convection and thereby advantageously allows components that are operating at very different temperatures to be housed in the same chassis or another such structure. Housing 110 may also maintain thermal insulation with respect to ambient temperature.

With continued reference to FIG. 1, housing 110 may include one or more chassis for receiving blades (e.g., computing blades). As used herein, the term "chassis" includes, but is not limited to, any structure for interfacing with a blade having at least one circuit board. The term "chassis" also includes any parts that could be separately machined and installed as part of the structure for receiving the blade. In this example, housing 110 may include chassis 120. In one example, chassis 120 may have blades installed with only superconducting components operable in an environment having a temperature at or below 200 K. Alternatively, the circuit boards may include both superconducting components and semiconductor components (e.g., CMOS-based integrated circuits). The circuit boards may include components other than superconducting and non-superconductor components. As an example, the circuit boards may include components, such as passive resistors, discrete capacitors, discrete inductors, micro-electromechanical systems (MEMS), optical components, or other types of components used for computing, storage, and networking applications. Different temperature zones may be maintained in the housing depending on the types of components mounted on circuit boards inserted into the slots (e.g., slots 122 and 124) corresponding to chassis 120. This may be accomplished via a combination of thermal isolation and cooling via liquid helium or other such coolants. With respect to the components mounted on a circuit board, as used herein the phrase "operating in an environment having a temperature at or below" means that the respective circuit board is thermally linked to a chassis portion that is maintained at or below the specified temperature (e.g., a temperature of 200 K, 300 K, or 77 K).

Housing 110 may further include multiple thermal shields that may be configured to thermally isolate portions of each of the circuit boards inserted into the slots corresponding to chassis 120. In one example, the thermal shields may be formed using copper or aluminum and may further be wrapped in multi-layer insulation. FIG. 1 shows an example thermal shield 130 that may be cooled via liquid nitrogen or liquid helium flowing through each of the pipes 142 and 144 shown in FIG. 1. Pipes 142 and 144 carrying liquid nitrogen or liquid helium may be brazed to, or otherwise attached, to cold plates associated with the appropriate thermal environment. As an example, aluminum or copper sidewalls may be mounted adjacent to superconducting components. Aluminum or copper sidewalls may also be cooled via liquid nitrogen or liquid helium flowing through pipes (e.g., pipes 142 and 144 in FIG. 1.

Still referring to FIG. 1, a thermosiphon (or a similar system) may be used as part of the cooling system. As part of the thermosiphon, natural convection driven by gravity with the colder fluid (e.g., liquid helium or liquid nitrogen) flowing downhill and the warmer fluid flowing back up may be used to cool the cold plates and other components associated with the cooling system. The thermosiphon may include liquid flowing down and vapor flowing back. It is to be recognized that the temperature ranges referred to herein relate to the temperature of the heat transfer elements (e.g., the heat spreaders or the chassis) to which these components are coupled and not the temperature of the components themselves. Thus, references such as the components are "operating at" or "maintained at" refer to the temperature of the heat transfer elements to which these components are coupled for heat transfer purposes. Although FIG. 1 shows a certain arrangement of components, substrates, and other component, these could be arranged in a different manner. In addition, fewer or additional components, substrates, and other components may be present.

Figure 2:
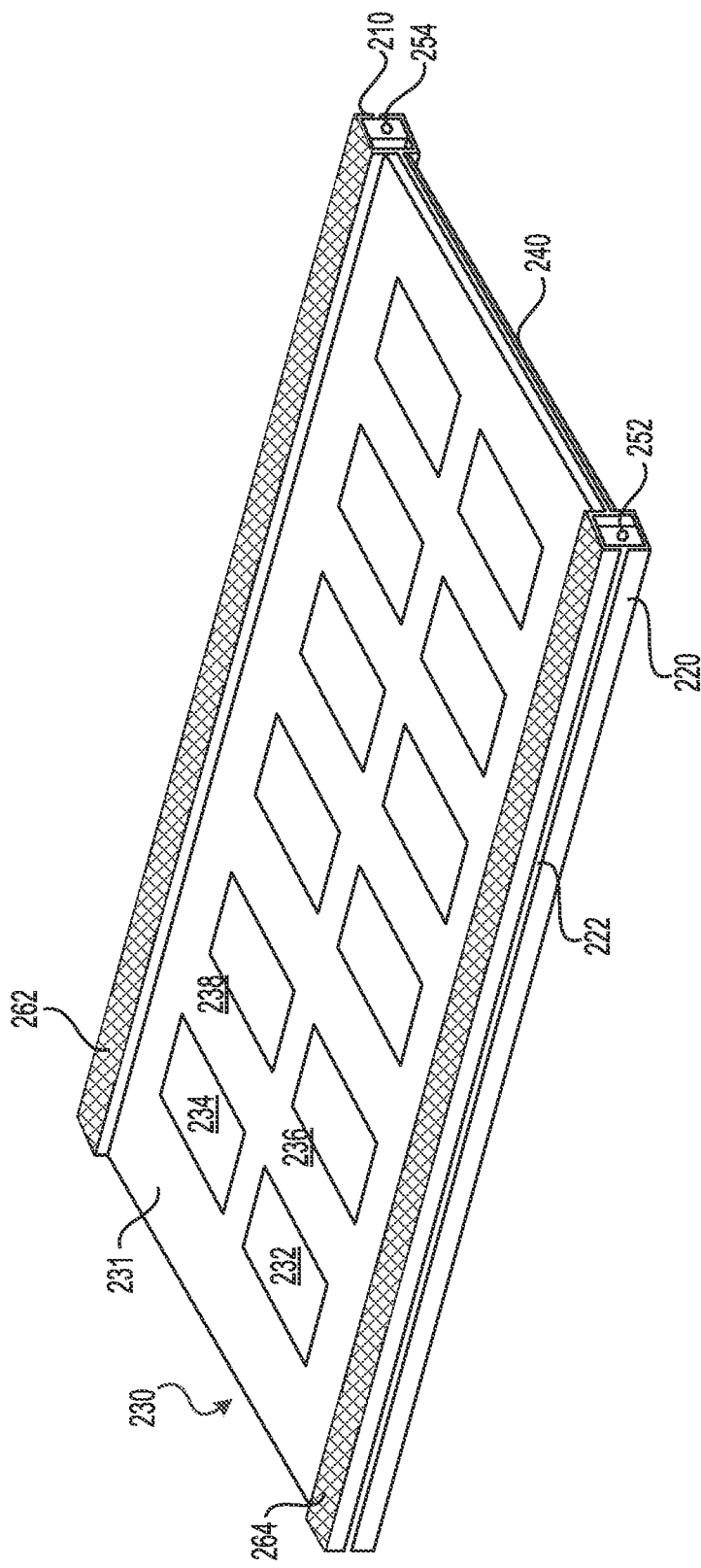
FIG. 2 shows a diagram of a blade for use with the chassis of FIG. 1 in accordance with one example.

FIG. 2 shows a diagram of a blade 200 for use in chassis 120 of FIG. 1 in accordance with one example. Blade 200 may comprise one or more circuit boards. As used herein, the term "blade" includes, but is not limited to, computing blades, storage blades, communication blades, or a combination of any computing, storage, or communication functionality. In addition, the term "blade" includes any shapes or sizes of structures for mounting at least one circuit board into a chassis. Each of the circuit boards may have several integrated circuits mounted on it. In addition, each of the circuit boards may be bonded to respective heat spreaders. In this example, blade 200 may include a heat spreader 210 bonded to a circuit board 230 having a substrate 231 with superconducting components 232, 234, 236, and 238 mounted on it. In this example, superconducting components 232, 234, 236, and 238 may be configured to operate in an environment having a temperature at or below 4.2 K. Superconducting components 232, 234, 236, and 238 may be packaged and formed in many different configurations. As an example, the superconducting components may be configured as multi-chip modules, ball-grid array (BGA) packages, system-in-packages (SIPs), or package-on-packages (POPs). Blade 200 may further include another heat spreader 220 bonded to another circuit board 240. Although not shown in FIG. 2, circuit board 240 may also have a substrate with superconducting components mounted on it. In one example, superconducting components may include Central-Processing Units (CPUs), Graphics-Processing Units (GPUs), Artificial Intelligence Processors, Field-Programmable Gate Arrays (FPGAs), Application-Specific Integrated Circuits (ASICs), Application-Specific Standard Products (ASSPs), System-on-a-Chip systems (SOCs), or Complex Programmable Logic Devices (CPLDs).

With continued reference to FIG. 2, heat spreader 210 may have at least two surfaces 262 and 264 that interface with a respective portion of a chassis (e.g., chassis 120 of FIG. 1) configured to receive blade 200. In this example, heat spreader 210 may be made of either aluminum or another type of metal. In one example, the aluminum may be high purity aluminum having at least 99.999 percent aluminum by weight. In another example, the aluminum may be high purity aluminum having at least 99.99 percent aluminum by weight. Indium may be pressed onto surfaces 262 and 264 by applying a high pressure. In one example, the pressure may be in a range between 4,000 pounds per square inch (PSI) to 16,000 PSI. Prior to pressing the indium, surfaces 262 and 264 may be cleaned using water or alcohol. Surfaces 262 and 264 may also be treated with acid to remove oxides. By limiting the displacement of the press by using a die, the thickness of indium can be set to a predetermined thickness as it extrudes during the pressing process. In this example, the pressure used to press indium against these surfaces results in a permanent bonding of the indium to the metal used to form heat spreader 210. In this manner several objectives are achieved: (1) a good mechanical bond between indium and the heat spreader, (2) a good thermal bond between indium and the heat spreader, and (3) a flat indium surface. Advantageously, this process incudes no heating of any of the parts being bonded together. In one example, heat spreader 210 may be formed using pure aluminum, and indium may be permanently bonded to the appropriate surfaces of heat spreader 210. In one example, the aluminum may be high purity aluminum having at least 99.999 percent aluminum by weight. In another example, the aluminum may be high purity aluminum having at least 99.99 percent aluminum by weight. Indium could also be used to renew surfaces of a heat spreader having preexisting indium by pressing additional indium onto such surfaces.

Still referring to FIG. 2, indium may similarly be permanently bonded to certain surfaces of heat spreader 220 as well. Blade 200 may further comprise two wedge locks 252 and 254. Once blade 200 is inserted into a slot, wedge locks 252 and 254 may be used to press heat spreaders in a way such that each heat spreader is tightly coupled with an opposing surface of the chassis. This process may increase gap 222 between heat spreader 210 and heat spreader 220. Indium, once permanently bonded to the appropriate surfaces of the heat spreaders, may stick to these surfaces such that even when blade 200 is removed and reinserted into a slot associated with the chassis the indium may not fall off or otherwise be removed. Although the example in FIG. 2 refers to the use of aluminum, other metals may also be used. As an example, a high residual-resistance ratio (RRR) copper may also be used. In addition, instead of wedge locks other types of clamping devices may be used. Moreover, the surfaces having indium permanently bonded to are merely shown as examples. Indium, or a similar metal, may be bonded to other surfaces of the heat spreaders and the substrates associated with the circuit boards.

Figure 3:
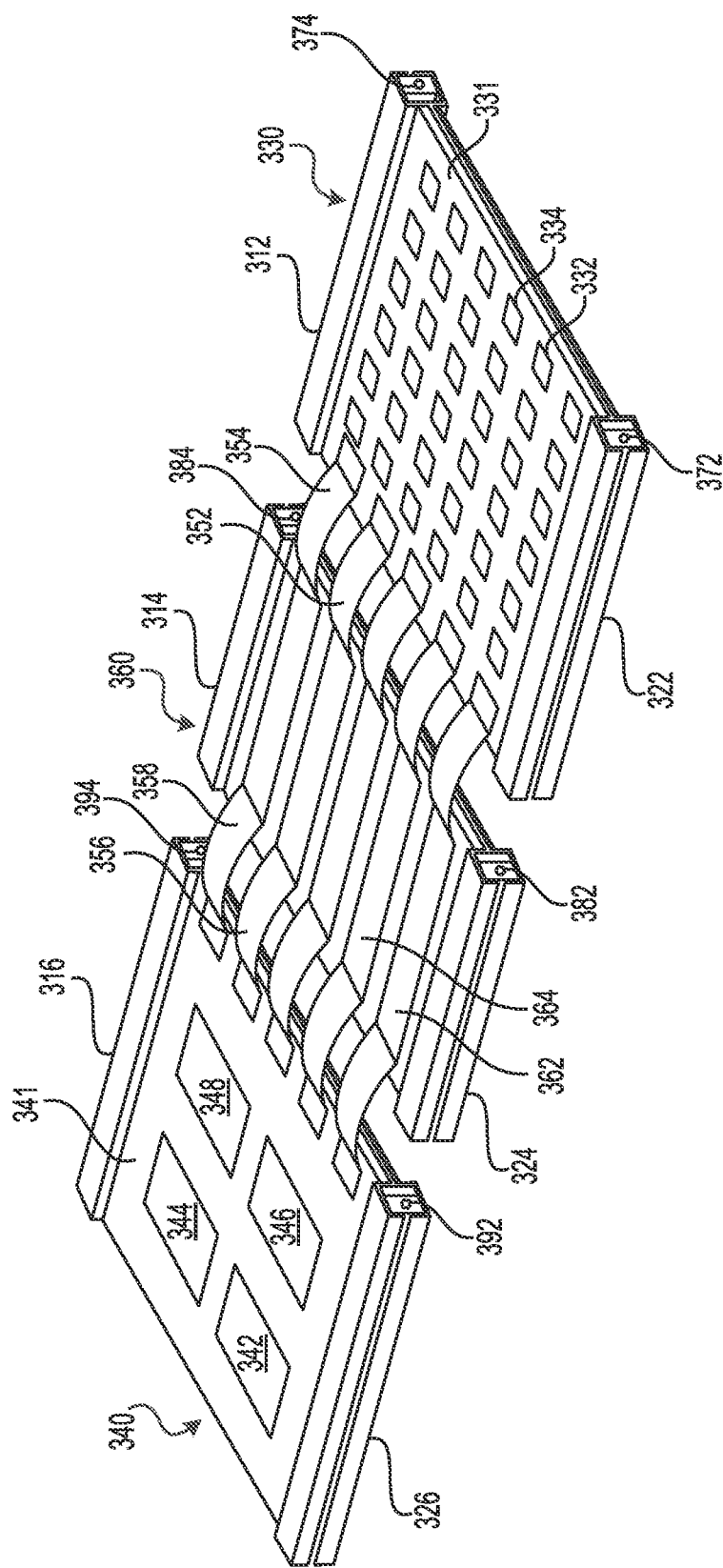
FIG. 3 shows a diagram of another blade for use with the chassis of FIG. 1 in accordance with another example.

FIG. 3 shows a diagram of a circuit board 300 in accordance with one example. Blade 300 may comprise one or more circuit boards. Each of the circuit boards incorporated as part of blade 300 may have several integrated circuits mounted on it. In addition, each of the circuit boards may be bonded to respective heat spreaders. In this example, blade 300 may include two circuit boards 330 and 340. Circuit boards 330 and 340 may be interconnected via a combination of rigid and flexible interconnects. Flexible interconnects 352 and 354 may be used to connect the components mounted on circuit board 330 with connectors 362 and 364 bonded to another circuit board 360. Similarly, flexible interconnects 356 and 358 may be used to connect the components mounted on circuit board 340 with the connectors bonded to circuit board 360. Other interconnection arrangements may also be used to allow for signals to propagate from one circuit board to the other circuit board and vice-versa.

With continued reference to FIG. 3, circuit board 330 may include non-superconducting components (e.g., CMOS, BiCMOS, or other type of devices that are suitable for operation without requiring cryogenic temperatures). As an example, non-superconducting components may include components 332 and 334 mounted on substrate 331. In this example, non-superconducting components 332 and 334 may be configured to operate in an environment having a temperature above 77 K and up to 400 K. In one example, the preferred temperature may be 233 K. The temperature environment may be maintained via a combination of thermal isolation and cooling using water or some other coolant. As an example, copper sidewalls (included as part of chassis 120 or otherwise coupled to chassis 120) may be mounted adjacent to the non-superconducting components. Copper sidewalls may also be cooled via water (or some other coolant) flowing through pipes or other means. Non-superconducting components 332 and 334 may be packaged and formed in many different configurations. As an example, the non-superconducting components may be configured as multi-chip modules, ball-grid array (BGA) packages, system-in-packages (SIPs), or package-on-packages (POPs). In this example, the non-superconducting components may comprise memory components, including any of non-volatile or volatile memory components. Volatile memory components may include any of the various types of random-access memory components, including dynamic random-access memory (DRAM) components. Non-volatile memory components may include any of various types of memory components that can store information even when they are not powered, including flash-memory components. Non-superconducting components may further include Field-Programmable Gate Arrays (FPGAs), Application-Specific Integrated Circuits (ASICs), Application-Specific Standard Products (ASSPs), System-on-a-Chip systems (SOCs), or Complex Programmable Logic Devices (CPLDs). Thus, while the non-superconducting components may also include components, such as ASICs, ASSPs, SOCs, CPLDs, or other types of controllers that may coordinate communication between the superconducting components and the non-superconducting components. The non-superconducting components may be formed using various semiconductor fabrication processes, including photo-imaging, patterning, annealing, contact formation, and packaging.

Still referring to FIG. 3, circuit board 340 may include superconducting components 342, 344, 346, and 348 mounted on a substrate 341. In this example, superconducting components 342, 344, 346, and 348 may be configured to operate in an environment having a temperature at or below 4.2 K. The temperature environment may be maintained as described in FIG. 1. Superconducting components 342, 344, 346, and 348 may be packaged and formed in many different configurations. As an example, the superconducting components may be configured as multi-chip modules, ball-grid array (BGA) packages, system-in-packages (SIPs), or package-on-packages (POPs). In one example, superconducting components may include Central-Processing Units (CPUs), Graphics-Processing Units (GPUs), Artificial Intelligence Processors, Field-Programmable Gate Arrays (FPGAs), Application-Specific Integrated Circuits (ASICs), Application-Specific Standard Products (ASSPs), System-on-a-Chip systems (SOCs), or Complex Programmable Logic Devices (CPLDs).

Each of the superconducting components may include a stack of superconducting layers and dielectric layers formed on a substrate. In one example, the superconducting components may be formed to support signals ranging from DC to signals having a frequency that is greater than 10 GHz. In this example, the superconducting components may be fabricated over large silicon substrates such as 200 mm wafers, 300 mm wafers or even larger wafers, which may be separated into multiple dies. In one example, the substrate could be made from silicon or any other thermally insulating or conducting material. Also, in this example, signal traces and ground planes may be formed by sputtering niobium, or a similar superconducting material. As an example, compounds of niobium such as niobium nitride (NbN) or niobium titanium nitride (NbTiN) may also be used. Other physical vapor deposition (PVD) methods, such as molecular beam epitaxy (MBE), may also be used. Depending on the type of the material used for the traces, sputtering processes, chemical vapor deposition (CVD) processes, plasma enhanced chemical vapor deposition (PECVD) process, evaporation processes, or atomic layer deposition (ALD) processes may also be used. Thus, for example, the niobium compounds such as NbN and NbTiN may be formed using a CVD process.

Superconducting components may include a dielectric layer formed over a substrate. The dielectric layer may be formed by depositing a dielectric (e.g., liquid crystal polymer (LCP)) on the chip substrate. A superconducting layer may be formed over the dielectric layer. The superconducting layer may be formed using any of the deposition techniques, such as CVD or PECVD, and then patterning the deposited material using photolithography. The layout for the superconducting structures may be created using a place and route design tool that is used to create the layout for the superconducting wires or other elements. As an example, photo-resist may be patterned to protect only those areas of the superconducting layer that will be formed as superconducting wires or other structures as defined by the layout of the particular layer, such as a metal layer. Other superconducting metals or metal alloys may also be used as part of this step. In one example, the vias and the traces may be formed by conformal deposition of niobium in the same deposition step as the one used for forming the traces. The via wells could be patterned directly in a photo-imagable polyimide or etched in a separate step. The metal traces and vias may be defined in the same subtractive etch step. The pad connections may be configured to support Ti/Au or Ti/Al pads for a variety of wire bond or flip chip bump and wire bond technologies, such as Indium solder bump, Tin-Silver (Snag) solder bump, Gold stud bump, Copper pillar bump, or other electrical interconnect bump types.

With continued reference to FIG. 3, a heat spreader 312 may be bonded to substrate 331 of circuit board 330. Heat spreader 312 may have at least two surfaces (e.g., similar to surfaces 262 and 264 of heat spreader 210 in FIG. 2) that interface with a respective portion of a chassis (e.g., chassis 120 of FIG. 1) configured to receive blade 300. This way heat spreader 312 may allow transfer of heat from non-superconducting components (e.g., non-superconducting components 332 and 334) to a cooling system associated with a system comprising blade 300. Another heat spreader 322 may be bonded to a substrate of a circuit board mounted on an opposite side of circuit board 330. Similarly, a heat spreader 316 may be bonded to substrate 341 of circuit board 340. Heat spreader 316 may have at least two surfaces (e.g., similar to surfaces 262 and 264 of heat spreader 210 in FIG. 2) that interface with a respective portion of a chassis (e.g., chassis 120 of FIG. 1) configured to receive blade 300. This way heat spreader 316 may allow transfer of heat from superconducting components (e.g., superconducting components 342, 344, 346 and 348) to a cooling system associated with a system comprising blade 300. Another heat spreader 326 may be bonded to a substrate of a circuit board mounted on an opposite side of circuit board 340. As explained earlier, components mounted on circuit boards 330 and 340 may be interconnected via flexible interconnects, which in turn may be coupled to circuit board 360. A heat spreader 314 may be bonded to circuit board 360. Heat spreader 314 may have at least two surfaces (e.g., similar to surfaces 262 and 264 of heat spreader 210 in FIG. 2) that interface with a respective portion of a chassis (e.g., chassis 120 of FIG. 1) configured to receive blade 300. This way heat spreader 314 may allow transfer of heat from the flexible interconnects and circuit board 360 to a cooling system associated with a system comprising blade 300. Another heat spreader 324 may be bonded to the other side of circuit board 360.

In this example, each of the heat spreaders associated with blade 300 may be made of either aluminum or another type of metal. In one example, the aluminum may be high purity aluminum having at least 99.999 percent aluminum by weight. In another example, the aluminum may be high purity aluminum having at least 99.99 percent aluminum by weight. Indium may be pressed onto relevant surfaces of the heat spreaders by applying a high pressure. In one example, the pressure may be in a range between 4,000 pounds per square inch (PSI) to 16,000 PSI. Prior to pressing the indium, the appropriate surfaces may be cleaned using water or alcohol. These surfaces may also be treated with acid to remove surface oxide. By limiting the displacement of the press by using a die, the thickness of indium can be set to a pre-determined thickness as it extrudes during the pressing process. In this example, the pressure used to press indium against these surfaces results in a permanent bonding of the indium to the metal used to form the heat spreaders. In one example, the heat spreaders (e.g., heat spreaders 312, 322, 314, 324, 316, and 326) may be formed using pure aluminum, and indium may be permanently bonded to the appropriate surfaces of the respective heat spreaders. In one example, the aluminum may be high purity aluminum having at least 99.999 percent aluminum by weight. In another example, the aluminum may be high purity aluminum having at least 99.99 percent aluminum by weight. Blade 300 may further comprise several wedge locks (e.g., wedge locks 372, 374, 382, 384, 392, and 394), which may function in a similar manner as the wedge locks described earlier with respect to FIG. 2. Indium, once permanently bonded to the appropriate surfaces of the heat spreaders, may stick to these surfaces such that even when blade 300 is removed and reinserted into a slot associated with the chassis the indium may not fall off or otherwise removed. Although the example in FIG. 3 refers to the use of aluminum, other metals may also be used. As an example, a high residual-resistance ratio (RRR) copper may also be used. In addition, instead of wedge locks other types of clamping devices may be used. Moreover, the surfaces having indium permanently bonded to are merely shown as examples. Indium, or a similar metal, may be bonded to other surfaces of the heat spreaders and the substrates associated with the circuit boards.

With respect to each of the circuit boards described with respect to blade 200 of FIG. 2 and blade 300 of FIG. 3, superconducting components or non-superconducting components may communicate with each other using circuit traces formed on the top or the bottom surface of each of the substrates (e.g., substrates 331 and 341). The circuit traces may be formed using a suitable manufacturing process, including, but not limited to, selective laser sintering, fused deposition modeling, direct metal laser sintering, stereolithography, cladding, electron beam melting, electron beam direct manufacturing, aerosol jetting, ink jetting, semi-solid freeform fabrication, digital light processing, 2 photon polymerization, laminated object manufacturing, 3D printing, or other similar manufacturing processes. In one example, the circuit traces may be made of niobium (or another suitable superconducting material) in a region of the substrate that includes superconducting components. This region may exclude any normal metal, e.g., copper metal. In the other region the circuit traces may be made of both niobium and copper (or another suitable metal or metal alloy comprising a superconducting metal and a normal metal) that includes the non-superconducting components.

Figure 4:
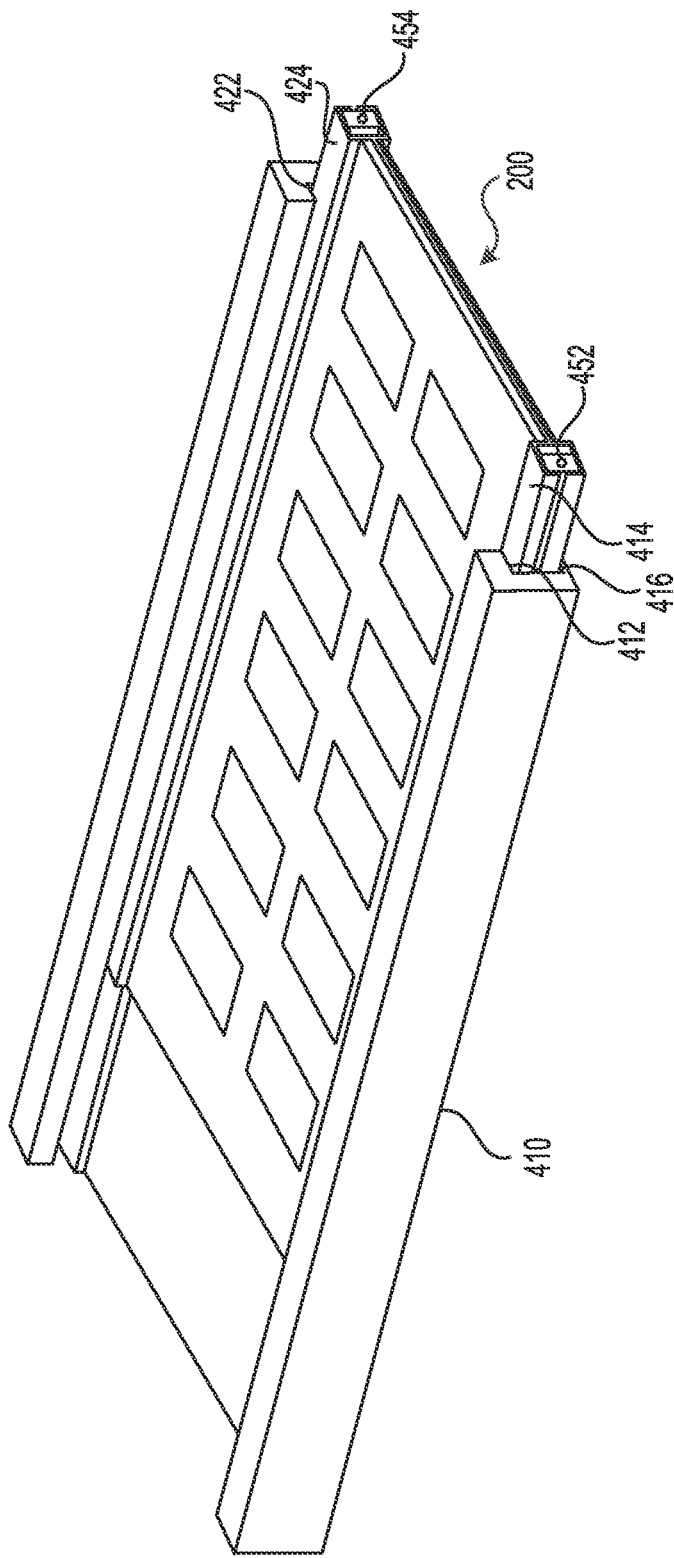
FIG. 4 shows a diagram of the blade of FIG. 2 partially inserted into a portion of a chassis in accordance with one example.

FIG. 4 shows a view 400 of blade 200 of FIG. 2 partially inserted into a portion of chassis 120 of FIG. 1 in accordance with one example. In this example, a portion 410 of the chassis may include several surfaces that interface with the surfaces of the heat spreaders having indium pressed into them. In this example, surface 414 of the top heat spreader is shown as interfacing with surface 412 of portion 410 of the chassis. In addition, surface 424 of the top heat spreader is shown as interfacing with surface 422 of the chassis. Another portion of the bottom heat spreader is shown as interfacing with surface 416 of portion 410 of the chassis. As explained earlier wedge locks 452 and 454 may be used to increase the pressure between the surfaces having indium pressed into them to improve heat transfer. Although FIG. 4 shows a certain arrangement of components, these could be arranged in a different manner. In addition, fewer or additional components, heat spreaders, and other circuit boards may be present.

Figure 5:
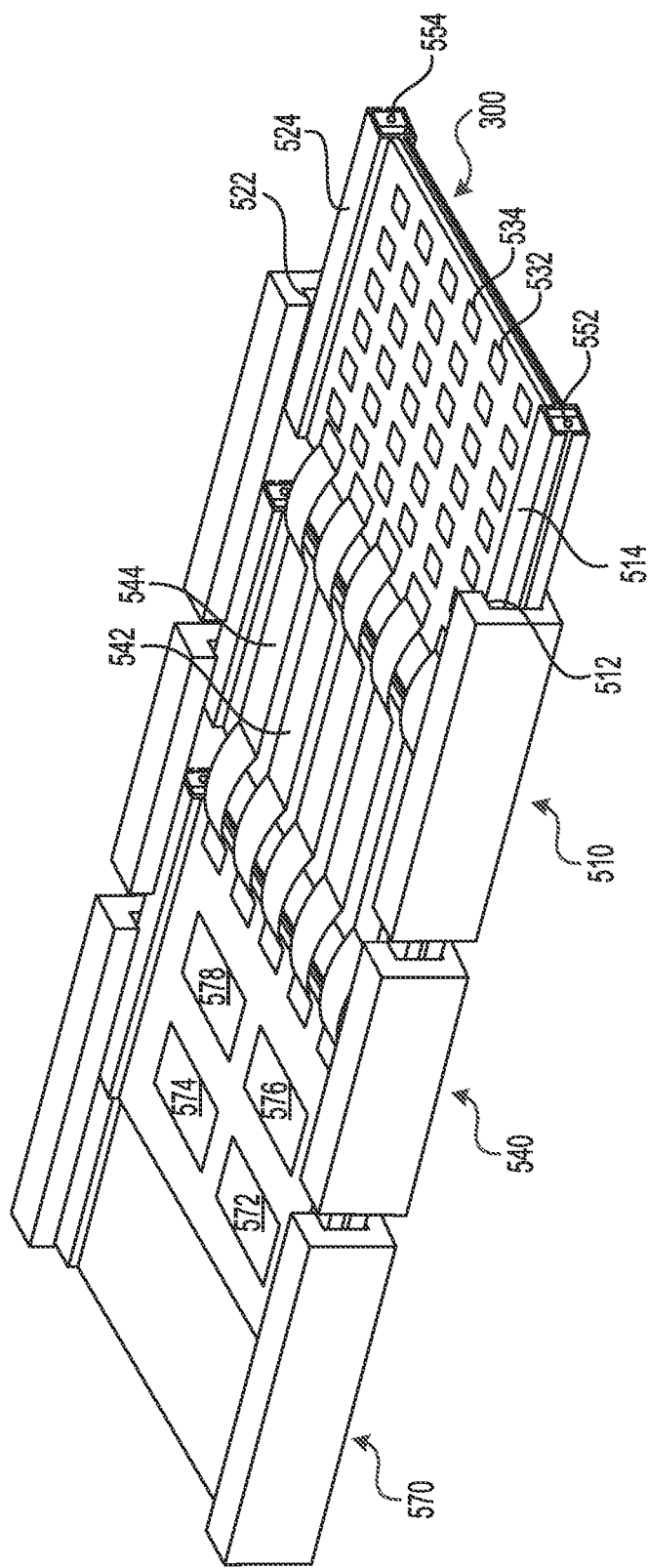
FIG. 5 shows a view of the blade of FIG. 3 partially inserted into portions of the chassis of FIG. 1 in accordance with one example.

FIG. 5 shows a view 500 of blade 300 of FIG. 3 partially inserted into a portions of chassis 120 of FIG. 1 in accordance with one example. In this example, portions 510, 540, and 570 of the chassis may include several surfaces that interface with the surfaces of the heat spreaders having indium pressed into them. In this example, surface 514 of the top heat spreader is shown as interfacing with surface 512 of portion 510 of the chassis. In addition, surface 524 of the top heat spreader is shown as interfacing with surface 522 of the chassis. As explained earlier wedge locks 552 and 554 may be used to tighten the coupling between the surfaces having indium pressed into them to improve heat transfer. Other heat spreaders may also have indium pressed into similar surfaces to allow for better thermal coupling between the heat spreaders and the respective portions of the chassis. In this example, portion 510 of the chassis may be associated with the circuit board having semiconductor components 532 and 534 mounted on it. Portion 540 of the chassis may be associated with the circuit board having connectors 542 and 544. Portion 570 of the chassis may be associated with the circuit board having superconducting components 572, 574, 576, and 578. Each portion of the chassis may be maintained at a different temperature by cooling the portion via heat transfer. Although FIG. 5 shows a certain arrangement of components, these could be arranged in a different manner. In addition, fewer or additional components, heat spreaders, and other circuit boards may be present.

Figure 6:
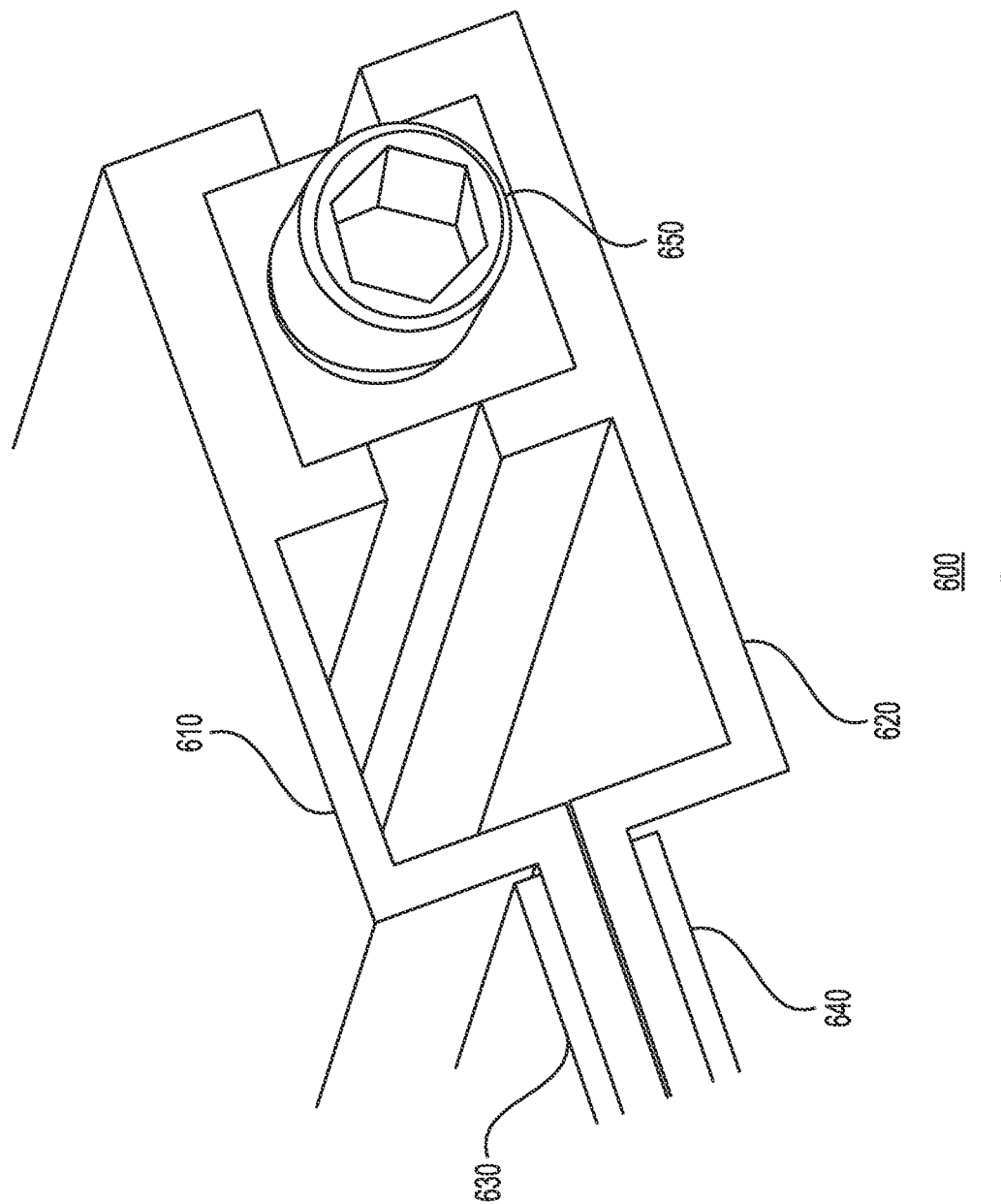
FIG. 6 is a view having additional details of a blade in accordance with one example.

FIG. 6 is a view 600 having additional details of a blade in accordance with one example. As shown in view 600, heat spreaders 610 and 620 may be spread apart from each other using wedge lock 650 to improve thermal contact between heat spreaders 610 and 620 and the chassis (or another heat transfer element). In this example, two circuit boards 630 and 640 are shown. A surface of circuit board 630 is bonded to a surface of heat spreader 610 and a surface of circuit board 640 is bonded to a surface of heat spreader 620. The thermal interface between the circuit boards and the heat spreaders may be flat. The efficient heat transfer via the interfaces (at the edges of the blade) between the heat spreader's surfaces and the chassis (as shown in FIG. 6 and earlier in FIGS. 4 and 5) may reduce the stress introduced by the coefficient of thermal expansion (CTE) mismatch between the material used to form the substrate and the metal used to form the heat spreader.

Figure 7:
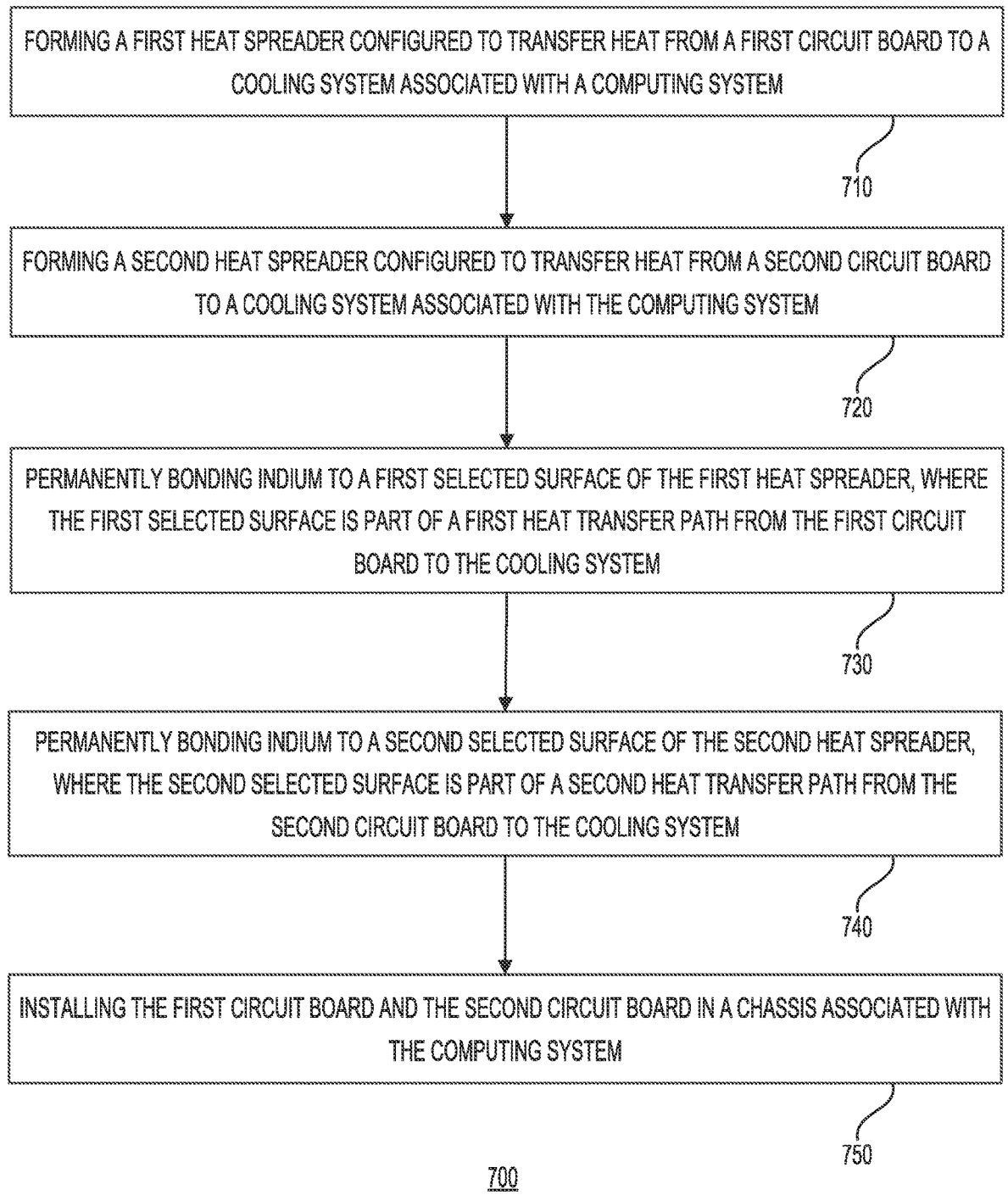
FIG. 7 shows a flow chart of a method for assembling a computing system comprising at least one blade.

FIG. 7 shows a flow chart 700 of a method for assembling a computing system comprising at least one blade. Step 710 may include forming a first heat spreader configured to transfer heat from the first circuit board to a cooling system associated with the computing system. The first heat spreader may be any of the heat spreaders described earlier. Step 720 may include forming a second heat spreader configured to transfer heat from the second circuit board to a cooling system associated with the computing system. Each of the first heat spreader and the second heat spreaders may be any of the heat spreaders described earlier with respect to blade 200 of FIG. 2 and blade 300 of FIG. 3. Similarly, each of the first circuit boards and the second circuit boards may be any of the circuit boards described earlier with respect to blade 200 of FIG. 2 and blade 300 of FIG. 3. In this example, forming the first heat spreader may include machining a first block of aluminum, and forming the second heat spreader may include machining a second block of aluminum. Each of the first block of aluminum and the second block of aluminum may be high purity aluminum having at least 99.999 percent aluminum by weight. In another example, the aluminum may be high purity aluminum having at least 99.99 percent aluminum by weight.

Step 730 may include permanently bonding indium to a first selected surface of the first heat spreader, where the first selected surface is part of a first heat transfer path from the first circuit board to the cooling system. Step 740 may include permanently bonding indium to a second selected surface of the second heat spreader, where the second selected surface is part of a second heat transfer path from the second circuit board to the cooling system. Prior to permanently bonding the indium, respective surfaces may be cleaned using water or alcohol. In one example, permanently bonding indium to the first selected surface of the first heat spreader may include extruding indium on to the first selected surface of the first heat spreader and pressing indium onto the first selected surface using a pressure in a range between 4,000 pounds per square inch (PSI) to 16,000 PSI. Similarly, permanently bonding indium to the second selected surface of the second heat spreader may include extruding indium on to the second selected surface of the second heat spreader and pressing indium onto the second selected surface using a pressure in a range between 4,000 pounds per square inch (PSI) to 16,000 PSI. Advantageously, no heat may be applied to any of the heat spreaders during the permanent bonding of indium to respective surfaces. By limiting the displacement of the press by using a die, the thickness of indium can be set to a pre-determined thickness as it extrudes during the pressing process. In this example, the pressure used to press indium against these surfaces results in a permanent bonding of the indium to the metal used to form the heat spreaders. In this manner several objects are achieved: (1) a good mechanical bond between indium and the heat spreader, (2) a good thermal bond between indium and the heat spreader, and (3) a flat indium surface.

Step 750 may include installing the first circuit board and the second circuit board in a chassis associated with the computing system. As an example, the circuit boards may be installed as part of blades described earlier into the chassis (e.g., chassis 120 of FIG. 1). Although flow chart 700 describes the steps being performed in a certain order, the steps need not be performed in this order. In addition, fewer or more steps may be performed as part of the method described with respect to flow chart 700 of FIG. 7.

In conclusion, in one aspect of the present disclosure a system including a housing configured to maintain a lower pressure inside the housing than a pressure outside the housing is provided. The system may further include a chassis, arranged inside the housing. The chassis may comprise at least one slot for receiving a blade. The blade may include a circuit board having a plurality of components mounted on a substrate. The chassis may be coupled to a cooling system to maintain at least a subset of the plurality of components operating in an environment having a temperature at or below 200 Kelvin. The blade, arranged in a slot of the chassis, may include a first heat spreader comprising a metal. The first heat spreader including metal may be arranged to transfer heat from the first circuit board to the cooling system via a first interface between a first surface of the first heat spreader and a second surface of the chassis, and where indium is permanently bonded to either the first surface of the first heat spreader, or the second surface of the chassis, or both the first surface of the first heat spreader and the second surface of the chassis.

Indium may be permanently bonded to either the first surface of the first heat spreader, or the second surface of the chassis, or both the first surface of the first heat spreader and the second surface of the chassis by pressing indium onto a respective surface using a pressure in a range between 4,000 pounds per square inch (PSI) to 16,000 PSI.

The blade may further include a second circuit board, mounted on an opposite side of the first circuit board, having a second plurality of components mounted on a second substrate and a second heat spreader comprising a metal, where the second heat spreader is arranged to transfer heat from the second circuit board to the cooling system via a second interface between a third surface of the second heat spreader and a fourth surface of the chassis, and where indium may be permanently bonded to either the third surface of the second heat spreader, or the fourth surface of the chassis, or both the third surface of the second heat spreader and the fourth surface of the chassis. Indium may be permanently bonded to either the third surface of the second heat spreader, or the fourth surface of the chassis, or both the third surface of the second heat spreader and the fourth surface of the chassis by pressing indium onto a respective surface using a pressure in a range between 4,000 pounds per square inch (PSI) to 16,000 PSI.

The blade may comprise a first wedge lock and a second wedge lock configured to spread the first heat spreader from the second heat spreader further apart to improve a thermal contact between the first heat spreader and the chassis and to improve a thermal contact between the second heat spreader and the chassis. The metal may be high purity aluminum having at least 99.99 percent aluminum by weight. The lower pressure inside the housing may correspond to a pressure in a range between $10^{-3}$ Torr to $10^{-10}$ Torr.

In another aspect the present disclosure relates to a method for assembling a computing system comprising at least one blade including a first circuit board and a second circuit board, where at least one of the first circuit board or the second circuit board includes superconducting components configured to operate in an environment having a temperature at or below 200 Kelvin. The method may include forming a first heat spreader configured to transfer heat from the first circuit board to a cooling system associated with the computing system. The method may further include forming a second heat spreader configured to transfer heat from the second circuit board to a cooling system associated with the computing system. The method may further include permanently bonding indium to a first selected surface of the first heat spreader, where the first selected surface is part of a first heat transfer path from the first circuit board to the cooling system. The method may further include permanently bonding indium to a second selected surface of the second heat spreader, where the second selected surface is part of a second heat transfer path from the second circuit board to the cooling system. The method may further include installing the first circuit board and the second circuit board in a chassis associated with the computing system.

As part of this method, forming the first heat spreader may comprise machining a first block of aluminum, and forming the second heat spreader may comprise machining a second block of aluminum, where each of the first block of aluminum and the second block of aluminum may be high purity aluminum having at least 99.99 percent aluminum by weight.

In addition, permanently bonding indium to the first selected surface of the first heat spreader may comprise extruding indium on to the first selected surface of the first heat spreader and pressing indium onto the first selected surface using a pressure in a range between 4,000 pounds per square inch (PSI) to 16,000 PSI. No heat may be applied to the first heat spreader during permanently bonding indium to the first selected surface of the first heat spreader.

Moreover, permanently bonding indium to the second selected surface of the second heat spreader may comprise extruding indium on to the second selected surface of the second heat spreader and pressing indium onto the second selected surface using a pressure in a range between 4,000 pounds per square inch (PSI) to 16,000 PSI. No heat may be applied the second heat spreader during permanently bonding indium to the second selected surface of the second heat spreader. Finally, prior to installing the first circuit board and the second circuit board in the chassis associated with the computing system, the method may include combining the first circuit board, the second circuit board, the first heat spreader, and the second heat spreader into a computing blade.

In yet another aspect, the present disclosure relates to a system including a housing configured to maintain a lower pressure inside the housing than a pressure outside the housing. The system may further include a chassis, arranged inside the housing, where the chassis comprises at least one slot for receiving a blade, where the blade comprises a first circuit board having a plurality of superconducting components mounted on a first substrate and a second circuit board having a plurality of non-superconducting components mounted on a second substrate. The chassis may be coupled to a cooling system to maintain the plurality of superconducting components operating in an environment having a temperature at or below 200 Kelvin. The chassis may be coupled to the cooling system to maintain the plurality of non-superconducting components operating in an environment having a temperature at or below 300 Kelvin. The blade, arranged in a slot of the chassis, may include a first heat spreader comprising a metal, where the first heat spreader is arranged to transfer heat from the first circuit board to the cooling system via a first interface between a first surface of the first heat spreader and a second surface of the chassis, and where indium is permanently bonded to either the first surface of the first heat spreader, or the second surface of the chassis, or both the first surface of the first heat spreader and the second surface of the chassis. The blade may further include a second heat spreader comprising a metal, where the second heat spreader is arranged to transfer heat from the second circuit board to the cooling system via a second interface between a third surface of the second heat spreader and a fourth surface of the chassis, and where indium is permanently bonded to either the third surface of the second heat spreader, or the fourth surface of the chassis, or both the third surface of the second heat spreader and the fourth surface of the chassis.

The first circuit board may be coupled via a first set of flexible interconnects to a third circuit board, the second circuit board may be coupled via a second set of flexible interconnects to the third circuit board, and the third circuit board may be maintained at a temperature equal to or below 77 Kelvin. The first set of flexible interconnects may be coupled to the second set of flexible interconnects to allow for exchange of signals between the plurality of superconducting components and the plurality of non-superconducting components.

Indium may be permanently bonded to either the first surface of the first heat spreader, or the second surface of the chassis, or both the first surface of the first heat spreader and the second surface of the chassis by pressing indium onto a respective surface using a pressure in a range between 4,000 pounds per square inch (PSI) to 16,000 PSI. In addition, indium may be permanently bonded to either the third surface of the second heat spreader, or the fourth surface of the chassis, or both the third surface of the second heat spreader and the fourth surface of the chassis by pressing indium onto a respective surface using a pressure in a range between 4,000 pounds per square inch (PSI) to 16,000 PSI.

The blade may comprise a first wedge lock and a second wedge lock configured to spread the first heat spreader from the second heat spreader further apart to improve a thermal contact between the first heat spreader and the chassis and to improve a thermal contact between the second heat spreader and the chassis.

It is to be understood that the methods, modules, and components depicted herein are merely exemplary. For example, and without limitation, illustrative types of superconducting devices may include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc.

In addition, in an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

Furthermore, those skilled in the art will recognize that boundaries between the functionality of the above-described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A system comprising:
a housing configured to maintain a lower pressure inside the housing than a pressure outside the housing; and
a chassis, arranged inside the housing, wherein the chassis comprises at least one slot for receiving a blade, wherein the blade comprises a first circuit board having a plurality of components mounted on a substrate and, wherein the chassis is coupled to a cooling system to maintain at least a subset of the plurality of components operating in an environment having a temperature at or below 200 Kelvin, and wherein:
the blade, arranged in the at least one slot of the chassis, comprising:
a first heat spreader comprising a metal, wherein the first heat spreader is arranged to transfer heat from the first circuit board to the cooling system via an interface between a first surface of the first heat spreader and a second surface of the chassis, and wherein indium is permanently bonded to either the first surface of the first heat spreader, or the second surface of the chassis, or both the first surface of the first heat spreader and the second surface of the chassis; and
wherein the blade further comprises a second circuit board, mounted on an opposite side of the first circuit board, having a second plurality of components mounted on a second substrate and a second heat spreader comprising a metal, wherein the second heat spreader is arranged to transfer heat from the second circuit board to the cooling system via a second interface between a third surface of the second heat spreader and a fourth surface of the chassis, and wherein indium is permanently bonded to either the third surface of the second heat spreader, or the fourth surface of the chassis, or both the third surface of the second heat spreader and the fourth surface of the chassis.

2. The system of claim 1, wherein the indium is permanently bonded to either the first surface of the first heat spreader, or the second surface of the chassis, or both the first surface of the first heat spreader and the second surface of the chassis by pressing indium onto a respective surface using a pressure in a range between 4,000 pounds per square inch (PSI) to 16,000 PSI.

3. The system of claim 1, wherein the indium is permanently bonded to either the third surface of the second heat spreader, or the fourth surface of the chassis, or both the third surface of the second heat spreader and the fourth surface of the chassis by pressing indium onto a respective surface using a pressure in a range between 4,000 pounds per square inch (PSI) to 16,000 PSI.

4. The system of claim 3, wherein the blade comprises a first wedge lock and a second wedge lock configured to spread the first heat spreader from the second heat spreader further apart to improve a thermal contact between the first heat spreader and the chassis and to improve a thermal contact between the second heat spreader and the chassis.

5. A method for assembling a computing system comprising at least one blade including a first circuit board and a second circuit board, wherein at least one of the first circuit board or the second circuit board includes superconducting components configured to operate in a cryogenic environment having a temperature at or below 200 Kelvin, the method comprising:
forming a first heat spreader configured to transfer heat from the first circuit board to a cooling system associated with the computing system;
forming a second heat spreader configured to transfer heat from the second circuit board to a cooling system associated with the computing system;
permanently bonding indium to a first selected surface of the first heat spreader, wherein the first selected surface is part of a first heat transfer path from the first circuit board to the cooling system;
permanently bonding indium to a second selected surface of the second heat spreader, wherein the second selected surface is part of a second heat transfer path from the second circuit board to the cooling system; and
installing the first circuit board and the second circuit board in a chassis associated with the computing system.

6. The method of claim 5, wherein forming the first heat spreader comprises machining a first block of aluminum, and wherein forming the second heat spreader comprises machining a second block of aluminum, wherein each of the first block of aluminum and the second block of aluminum comprising high purity aluminum having at least 99.99 percent aluminum by weight.

7. The method of claim 5, wherein permanently bonding indium to the first selected surface of the first heat spreader comprises extruding indium on to the first selected surface of the first heat spreader and pressing indium onto the first selected surface using a pressure in a range between 4,000 pounds per square inch (PSI) to 16,000 PSI.

8. The method of claim 7, wherein no heat is applied to the first heat spreader during permanently bonding indium to the first selected surface of the first heat spreader.

9. The method of claim 5, wherein permanently bonding indium to the second selected surface of the second heat spreader comprises extruding indium on to the second selected surface of the second heat spreader and pressing indium onto the second selected surface using a pressure in a range between 4,000 pounds per square inch (PSI) to 16,000 PSI.

10. The method of claim 9, wherein no heat is applied to the second heat spreader during permanently bonding indium to the second selected surface of the second heat spreader.

11. The method of claim 5 further comprising prior to installing the first circuit board and the second circuit board in the chassis associated with the computing system, combining the first circuit board, the second circuit board, the first heat spreader, and the second heat spreader into a computing blade.

* * * * *